(12) United States Patent
Rajaei et al.

(10) Patent No.: US 11,909,521 B2
(45) Date of Patent: *Feb. 20, 2024

(54) METHOD FOR REDUCING FALSE DETECTION OF SUCCESSFUL DECODING OF CYCLIC REDUNDANCY CHECK CODES

(71) Applicant: VIAVI Solutions Inc., Chandler, AZ (US)

(72) Inventors: Saman Rajaei, London (GB); Hongyuan Huang, Letchworth Garden (GB)

(73) Assignee: VIAVI Solutions Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/930,873

(22) Filed: Sep. 9, 2022

(65) Prior Publication Data
US 2023/0006761 A1 Jan. 5, 2023

Related U.S. Application Data

(63) Continuation of application No. 16/867,186, filed on May 5, 2020, now Pat. No. 11,451,330.

(51) Int. Cl.
*H04W 4/00* (2018.01)
*H04L 1/00* (2006.01)
*G06N 20/00* (2019.01)

(52) U.S. Cl.
CPC .............. *H04L 1/004* (2013.01); *G06N 20/00* (2019.01)

(58) Field of Classification Search
CPC ...... H04L 1/004; H04L 1/0061; H04L 1/0072; H04L 1/0057; H04L 1/0054; G06N 20/00; H03M 13/09; H03M 13/13
See application file for complete search history.

(56) References Cited

U.S. PATENT DOCUMENTS 10,327,235 B2 6/2019 Shelby et al.
10,411,833 B2 9/2019 Sun et al.
(Continued)

OTHER PUBLICATIONS

Bai D., et al., "Near-Optimal Contraction of Voronoi Regions for Pruning of Blind Decoding Results," IEEE Transactions on Communications, Jun. 2015, vol. 63(6), pp. 1963-1974.
(Continued)

*Primary Examiner* — Frank Duong
(74) *Attorney, Agent, or Firm* — Harrity & Harrity, LLP

(57) ABSTRACT

A network testing device may receive, from a base station, an encoded physical downlink control channel (PDCCH) payload and decode the encoded PDCCH payload to obtain candidate PDCCH payloads and to generate path metrics (PMs), wherein each PM of the PMs corresponds to one candidate PDCCH payload of the candidate PDCCH payloads. The network testing device may perform a cyclic redundancy check on each of the candidate PDCCH payloads to determine, from the PMs, a passing PM, and may determine, based on the PMs, a confidence value associated with the passing PM. The network testing device may discard, based on determining that the confidence value does not satisfy a threshold, the passing PM, or may output, based on determining that the confidence value satisfies the threshold, a candidate PDCCH payload corresponding to the passing PM. The network testing device may transmit, based on the candidate PDCCH payload, data to the base station.

20 Claims, 10 Drawing Sheets

(56) References Cited

U.S. PATENT DOCUMENTS

| | | | |
|---|---|---|---|
| 10,784,991 | B2 | 9/2020 | Lin et al. |
| 11,451,330 | B2 | 9/2022 | Rajaei et al. |
| 2017/0366199 | A1 | 12/2017 | Ge et al. |
| 2018/0323803 | A1 | 11/2018 | Palgy et al. |
| 2018/0323809 | A1 | 11/2018 | Lin et al. |
| 2018/0323810 | A1 | 11/2018 | Sarkis et al. |
| 2019/0097756 | A1 | 3/2019 | Chatterjee et al. |
| 2019/0097760 | A1 | 3/2019 | Hwang et al. |
| 2019/0165889 | A1 | 5/2019 | Hwang et al. |
| 2020/0067639 | A1* | 2/2020 | Lin .................. H04L 1/0061 |
| 2020/0076535 | A1 | 3/2020 | Xu et al. |
| 2020/0204300 | A1 | 6/2020 | Hwang et al. |
| 2020/0235854 | A1 | 7/2020 | Xu et al. |

OTHER PUBLICATIONS

Bai D., et al., "Systematic pruning of blind decoding results," in 2012 Conference Record of the Forty-Sixth Asilomar Conference on Signals, Systems, and Computers (ASILOMAR), Pacific Grove, CA, 2012, 6 pages.

Balatsoukas-Stimming et al., "LLR-Based Successive Cancellation List Decoding of Polar Codes," IEEE, Mar. 6, 2015, vol. 63(19), pp. 1-15.

Cammerer et al., "Scaling Deep Learning-based Decoding of Polar Codes via Partitioning," arXiv, Feb. 22, 2017, pp. 1-6.

Extended European Search Report for Application No. EP21170426.7, dated Jan. 4, 2022, 14 pages.

Liu et al., "Improved Polar SCL Decoding by Exploiting the Error Correction Capability of CRC," IEEE, Jan. 23, 2019, vol. 7, pp. 1-9.

Partial European Search Report for Application No. EP21170426.7, dated Sep. 24, 2021, 17 pages.

Qualcomm Incorporated., "3GPP R1-161 0141_Short_Blocklength_Design," 3rdGeneration Partnership Project, F-06921 Sophia-Antipolis Cedex, France, Oct. 9, 2016, vol. RAN WG1, pp. 1-18, XP051150164, Retrieved from the Internet: [URL:http://www.3gpp.org/ftp/Meetings_3GPP_SYNC/RAN1/Docs/][retrieved on Oct. 9, 2016].

* cited by examiner

METHOD FOR REDUCING FALSE DETECTION OF SUCCESSFUL DECODING OF CYCLIC REDUNDANCY CHECK CODES

RELATED APPLICATION

This application is a continuation of U.S. patent application Ser. No. 16/867,186, filed May 5, 2020 (now U.S. Pat. No. 11,451,330), which is incorporated herein by reference in its entirety.

BACKGROUND

A fifth generation (5G) telecommunications system may utilize a control channel (CCH) that includes one or more downlink physical channels, such as a physical downlink control channel (PDCCH). The PDCCH carries downlink control information (DCI), such as scheduling assignments, to user devices in an area of coverage of a base station associated with the 5G telecommunications system.

SUMMARY

According to some implementations, a method may include receiving, by a device and from a base station, an encoded physical downlink control channel (PDCCH) payload; decoding, by the device, the encoded PDCCH payload to obtain candidate PDCCH payloads and to generate path metrics (PMs), wherein each PM of the PMs corresponds to one candidate PDCCH payload of the candidate PDCCH payloads; performing, by the device, a cyclic redundancy check (CRC) on each of the candidate PDCCH payloads to determine, from the PMs, a passing PM; determining, by the device and based on the PMs, a confidence value associated with the passing PM; determining, by the device, whether the confidence value satisfies a threshold; discarding, by the device and based on determining that the confidence value does not satisfy the threshold, the passing PM; or outputting, by the device and based on determining that the confidence value does satisfy the threshold, a candidate PDCCH payload corresponding to the passing PM; and transmitting, by the device and based on the candidate PDCCH payload, data to the base station.

According to some implementations, a device may include one or more memories and one or more processors. The one or more processors may be configured to: receive, from a base station, a polar encoded PDCCH payload; decode, using a successive cancellation list decoding algorithm, the polar encoded PDCCH payload to obtain candidate PDCCH payloads and to generate PMs, wherein each PM of the PMs corresponds to one candidate PDCCH payload of the candidate PDCCH payloads; perform a cyclic redundancy check on each of the candidate PDCCH payloads to determine, from the PMs, a passing PM; determine, based on the PMs, a confidence value associated with the passing PM; determine whether the confidence value satisfies a threshold; discard, based on determining that the confidence value does not satisfy the threshold, the passing PM; or output, based on determining that the confidence value does satisfy the threshold, a candidate PDCCH payload corresponding to the passing PM; and transmit, based on the candidate PDCCH payload, data to the base station.

According to some implementations, a non-transitory computer-readable medium may store one or more instructions. The one or more instructions, when executed by one or more processors, may cause the one or more processors to: receive, from a base station, an encoded PDCCH payload; decode the encoded PDCCH payload to obtain candidate PDCCH payloads and to generate PMs, wherein each PM of the PMs corresponds to one candidate PDCCH payload of the candidate PDCCH payloads; perform a cyclic redundancy check on each of the candidate PDCCH payloads to obtain, from the PMs, a passing PM; determine, based on the PMs and using a machine learning model, a confidence value associated with the passing PM; determine whether the confidence value satisfies a threshold; discard, based on determining that the confidence value does not satisfy the threshold, the passing PM; or output, based on determining that the confidence value does satisfy the threshold, a candidate PDCCH payload corresponding to the passing PM; and transmit, based on the candidate PDCCH payload, data to the base station.

DETAILED DESCRIPTION OF PREFERRED EMBODIMENTS

Figure 1A:
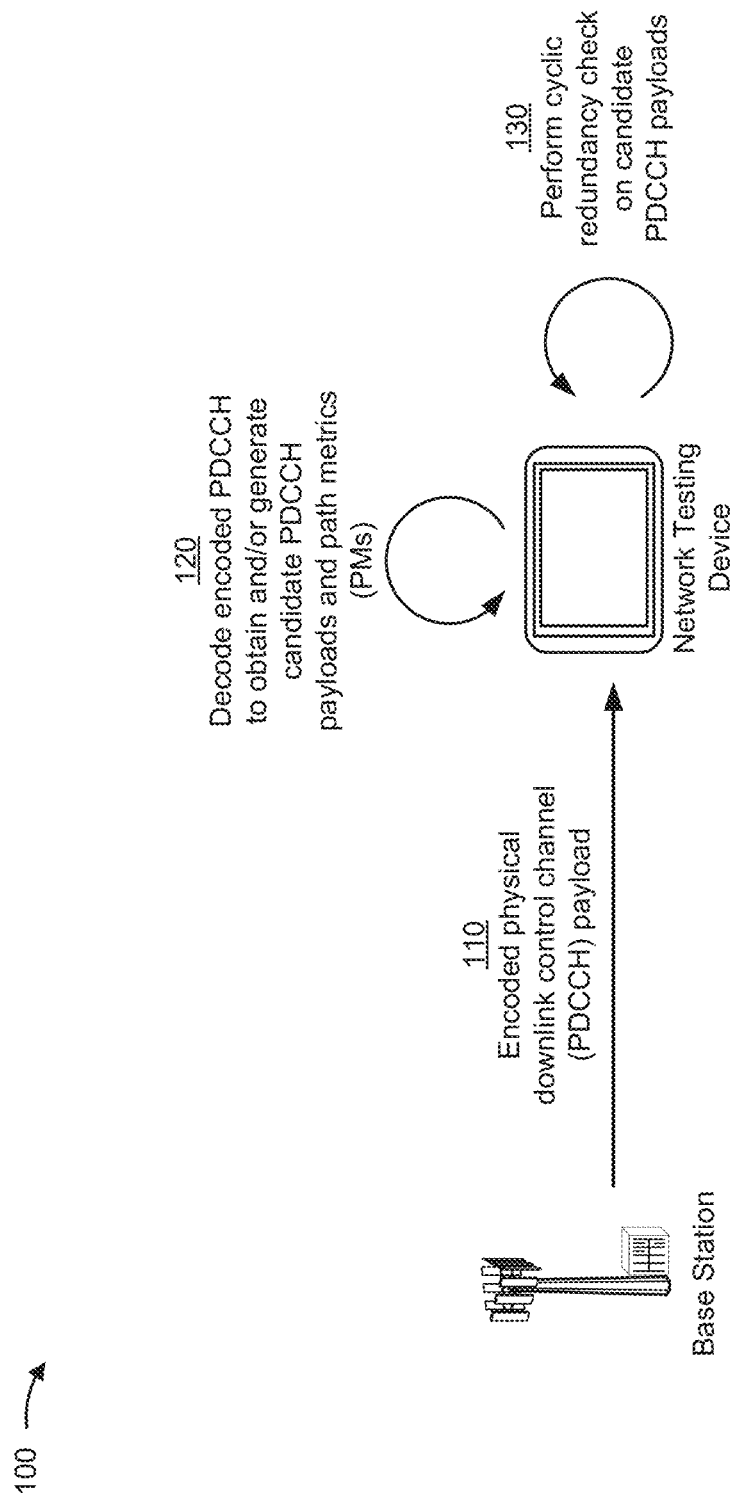
FIGS. 1A-1C are diagrams of an example implementation described herein.

The following detailed description of example implementations refers to the accompanying drawings. The same reference numbers in different drawings may identify the same or similar elements.

Often, when a user device receives an encoded physical downlink control channel (PDCCH) payload from a base station, the user device attempts to locate, in the encoded PDCCH payload, control information (e.g., downlink control information (DCI)) intended specifically for the user device to use to communicate with the base station. In some cases, to locate the control information, the user device uses a decoding process, such as a successive cancellation list (SCL) decoding algorithm, to generate and/or obtain candidate PDCCH payloads (e.g., where a candidate PDCCH payload may be associated with the control information) and respective path metrics (PMs). The user device performs a cyclic redundancy check (CRC) on the candidate PDCCH payloads to identify a PM that is error-free. The user device decodes, using the error-free PM, a candidate PDCCH payload corresponding to the error-free PM, and transmits, based on the candidate PDCCH payload, information to the base station.

However, in many cases, the CRC may fail to identify errors in a PM and may incorrectly indicate that the PM is error-free, which is referred to as a CRC mis-detection. Additionally, or alternatively, the CRC may indicate that a PM is error-free when the PM is purely random, such as when the user device mistakenly identifies noise as an encoded PDCCH payload, which is referred to as a CRC false alarm. The user device then attempts to transmit information with the base station based on the PM including an error and/or the purely random PM, and the transmission fails.

When the transmission fails, the user device obtains another encoded PDCCH payload and repeats the attempt. For a single user device, such as a mobile device, CRC mis-detections and CRC false alarms are often infrequent. However, for a network testing device (e.g., that tests one or more functionalities of a base station) that emulates multiple user devices (e.g., hundreds, thousands, or even millions of UEs), CRC mis-detections and CRC false alarms may be very frequent and may consume computing resources (e.g., processing resources, memory resources, power resources, communication resources, and/or the like), network resources, and/or financial resources by extending a length of time and a number of procedures required to perform network testing.

Some implementations described herein provide a method that includes determining a confidence value associated with a passing PM (e.g., a PM that a CRC indicates is error-free). The confidence value may be determined by normalizing PM values of the PMs, averaging the normalized PM values, and determining a difference between a normalized PM value of the passing PM and the averaged normalized PM value. The method may include determining whether the confidence value satisfies a threshold. The method may include, if the confidence value does not satisfy the threshold, discarding the passing PM. The method may include, if the confidence value does satisfy the threshold, outputting a candidate PDCCH payload corresponding to the passing PM, and transmitting, based on the candidate PDCCH payload, data to a base station. In some implementations, the method may include using a machine learning model to determine the confidence value and/or the threshold. By determining whether the confidence value of the passing PM satisfies the threshold, the method may detect CRC mis-detections and/or CRC false alarms. In this way, the method may conserve computing resources (e.g., processing resources, memory resources, power resources, communication resources, and/or the like), network resources, and/or financial resources that would otherwise be consumed by CRC mis-detections and/or CRC false alarms extending a length of time and a number of procedures required to perform network testing.

Figure 1B:
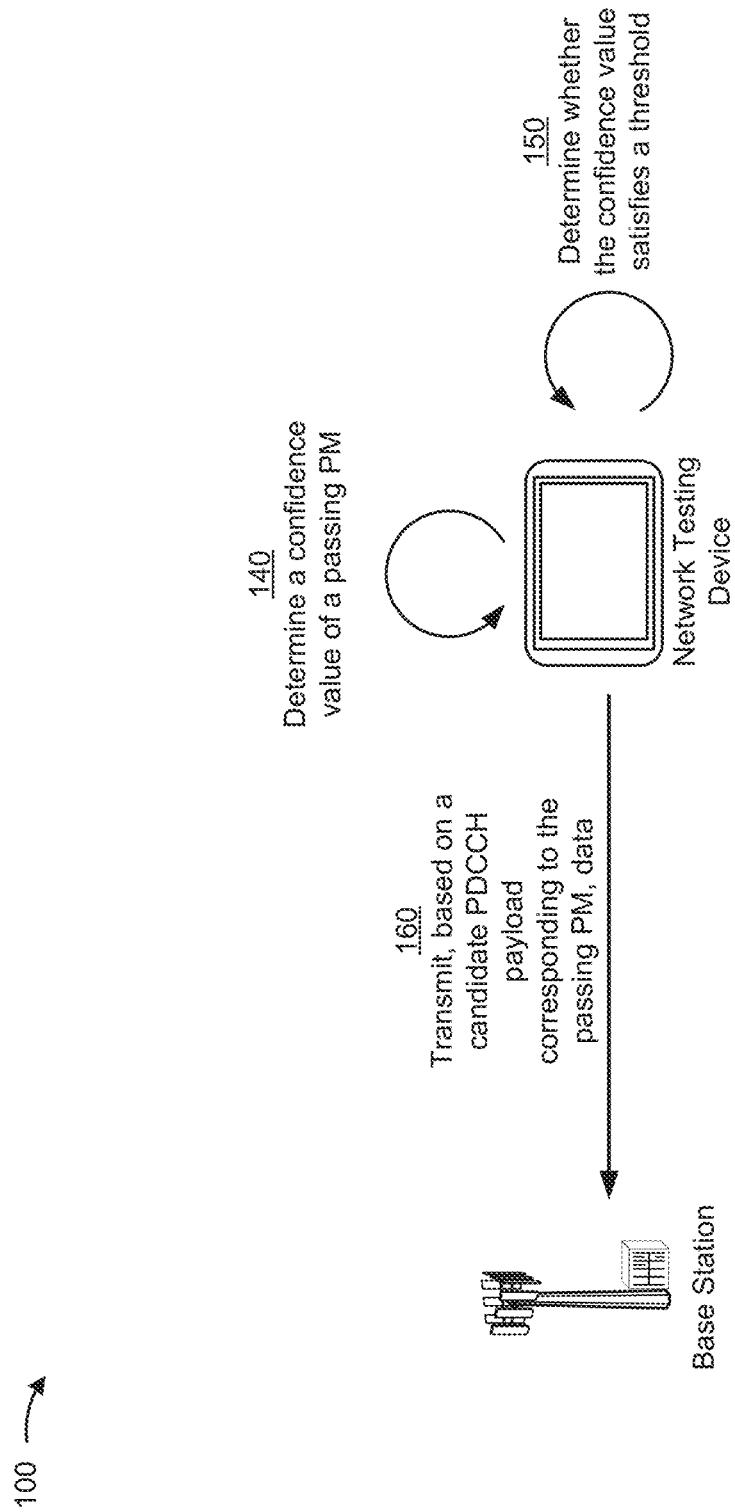
Figure 1C:
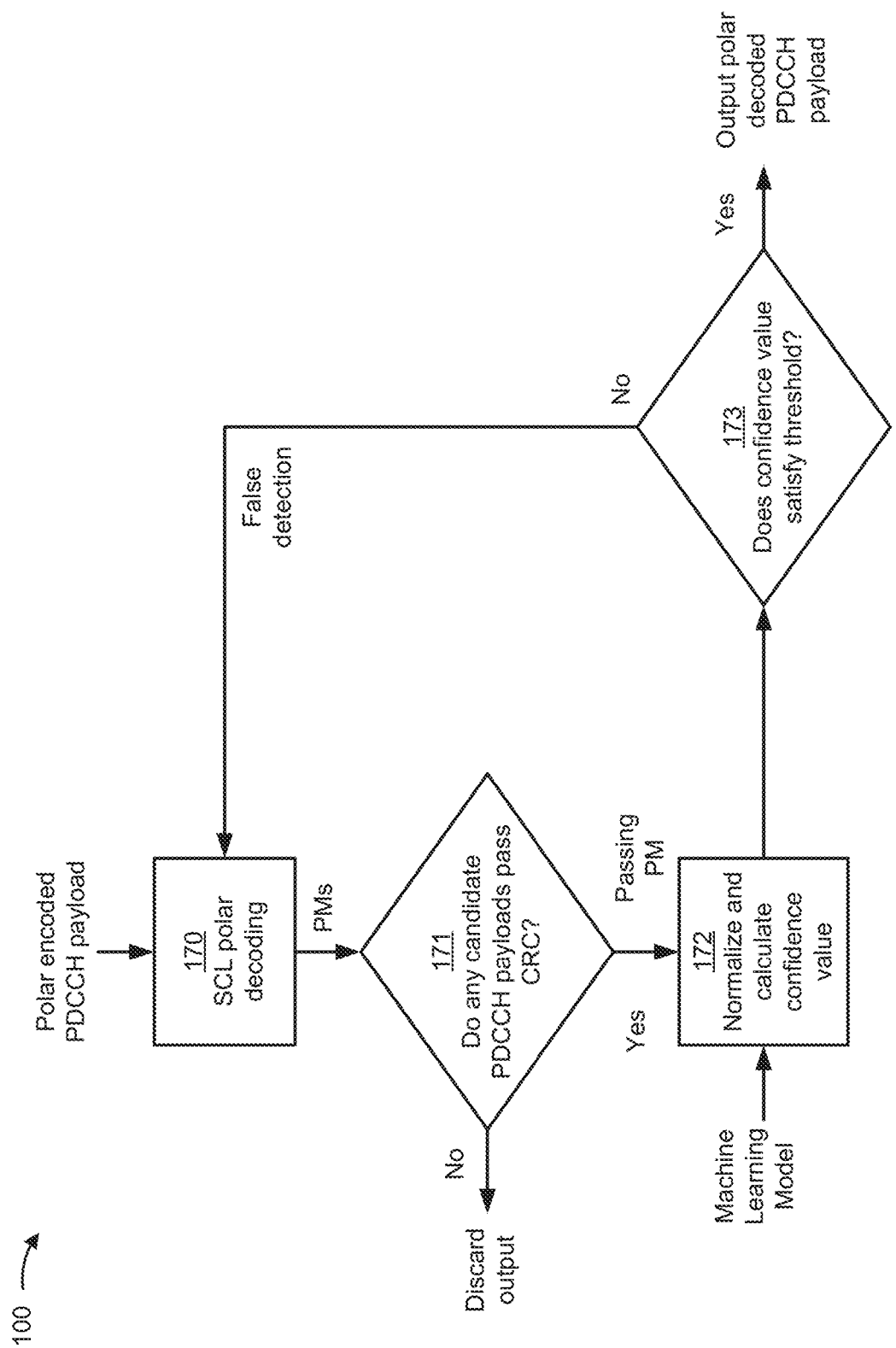

FIGS. 1A-1C are diagrams of one or more example implementations 100 described herein. As shown in FIGS. 1A-1C, example implementation(s) 100 may include a base station, a network testing device, and/or the like. The network testing device may be configured to test one or more functionalities of the base station. For example, the network device may be configured to emulate, simulate, and/or the like a plurality of user devices that connect to and communicate with the base station.

As shown in FIG. 1A and by reference number 110, the network testing device may receive an encoded PDCCH payload from the base station. The encoded PDCCH payload may be a polar encoded PDCCH payload. As shown by reference number 120, the network testing device may decode (e.g., using a decoding algorithm) the encoded PDCCH payload. In some implementations, the network testing device may decode, using an SCL decoding algorithm, the encoded PDCCH payload to obtain and/or generate a plurality of candidate PDCCH payloads and a plurality of PMs, wherein each PM is respectively associated with a candidate PDCCH payload of the plurality of candidate PDCCH payloads. A candidate PDCCH payload may be associated with downlink control information (e.g., DCI) for a set of user devices (e.g., control information for one or more user devices). A PM may be associated with a decoding path to decode a candidate PDCCH payload associated with the PM. The PM may have a PM value (e.g., that numerically indicates the decoding path to decode the candidate PDCCH path associated with the PM).

As shown by reference number 130, the network testing device may perform a CRC on the plurality of candidate PDCCH payloads (e.g., on one or more candidate PDCCH payloads of the plurality of candidate PDCCH payloads). For example, the network testing device may perform the CRC on each of the candidate PDCCH payloads to identify a passing PM (e.g., a PM associated with a candidate PDCCH payload that is error-free). Identification of the passing PM may indicate that the candidate PDCCH payload associated with the passing PM was successfully decoded from the coded PDCCH payload. In some implementations, the network testing device may determine, based on performing the CRC, that a particular PM is not a passing PM (e.g., that the particular PM is not error-free), which may indicate that the candidate PDCCH payload associated with the particular PM was not successfully decoded from the coded PDCCH payload. The network device may therefore discard the particular PM and/or the candidate PDCCH payload associated with the particular PM. In some implementations, the network testing device may perform the CRC on each of the candidate PDCCH payloads to identify a plurality of passing PMs (e.g., a first PM that is error-free, a second PM that is error-free, and/or the like).

In some implementations, the network testing device may sequentially perform the CRC on the plurality of candidate PDCCH payloads to identify a passing PM. For example, the network testing device may perform the CRC on a first candidate PDCCH payload having a lowest PM value to determine whether the first PM is error-free. The network device may determine, based on determining that the first PM is error-free, that the first PM is a passing PM. Additionally, or alternatively, the network testing device may perform, based on determining that the first PM is not error-free, the CRC on a second candidate PDCCH payload having a second lowest PM value to determine whether the second PM is error-free. The network device may determine, based on determining that the second PM is error-free, that the second PM is a passing PM. Additionally, or alternatively, the network testing device may perform, based on determining that the second PM is not error-free, the CRC on a third candidate PDCCH payload having a third PM value to determine whether the third PM is error-free. The network testing device may continue to perform the CRC in a similar manner on the remaining candidate PDCCH payloads, in order of lowest PM value to highest PM value, until a passing PM is identified.

As shown in FIG. 1B and by reference number 140, the network testing device may determine a confidence value associated with a passing PM. For example, the network testing device may normalize the respective PM values of the plurality of PMs to obtain a plurality of normalized PM values (e.g., a plurality of normalized values, where each normalized value is greater than 0 and less than or equal to 1). The network testing device may generate an average (e.g., a mathematical mean, a geometric mean, a harmonic mean, an interquartile mean, a truncated mean, and/or the like) of the plurality of normalized PM values to obtain an average normalized PM value. The network testing device may determine the confidence value associated with the passing PM based on the average normalized PM value. For example, the network testing device may determine a difference between a normalized PM value of the passing PM and the average normalized PM value to obtain the confidence value associated with the passing PM.

In some implementations, the network testing device may determine the confidence value associated with the passing PM using a machine learning model. For example, the network testing device may process the respective PM values of the plurality of PMs using the machine learning model to determine the confidence value associated with the passing PM. In some implementations, a network testing device platform may train the machine learning model using historical data associated with respective PM values of a plurality of PMs, historical data indicating which of the PMs of the plurality of PMs are passing PMs, historical data indicating respective confidence values associated with passing PMs, and/or the like. Using the historical data as inputs to the machine learning model, the network testing device may identify one or more relationships between sets of PM values and a confidence value associated with a passing PM. The machine learning model may be trained and/or used in a similar manner to that described below with respect to FIGS. 2 and 3.

Additionally, or alternatively, the network testing device may determine a confidence value associated with each PM of the plurality of PMs (e.g., in a similar manner as described above). In some implementations, the network testing device may determine the respective confidence values associated with the PMs while performing the CRC on the candidate PDCCH payloads.

As shown by reference number 150, the network testing device may determine whether a confidence value associated with a passing PM satisfies (e.g., is greater than or equal to) a threshold (e.g., a threshold associated with a reduction and/or prevention of CRC mis-detections and/or CRC false alarms). In some implementations, when the network testing device determines that the confidence value does not satisfy the threshold, the network testing device may discard the passing PM. Additionally, or alternatively, when the network testing device determines that the confidence value does satisfy the threshold, the network testing device may output a candidate PDCCH payload corresponding to the passing PM. For example, the network testing device may output the candidate PDCCH payload corresponding to the passing PM to allow the network testing device to modify functionality of one or more emulated, simulated, and/or the like user devices of the network testing device according to the control information included in the candidate PDCCH payload.

In some implementations, when the network testing device determines that the confidence value does not satisfy the threshold, the network testing device may determine, after discarding the passing PM, a confidence value associated with another passing PM (e.g., in a similar manner as described herein). The network testing device may determine whether the confidence value associated with the other passing PM satisfies the threshold. In some implementations, when the network testing device determines that the confidence value associated with the other passing PM does not satisfy the threshold, the network testing device may discard the other passing PM. Additionally, or alternatively, when the network testing device determines that the confidence value associated with the other passing PM does satisfy the threshold, the network testing device may output a candidate PDCCH payload corresponding to the other passing PM.

In some implementations, the network testing device may determine and/or set the threshold using an additional machine learning model. In some implementations, the network testing device platform may train the additional machine learning model using historical data associated with respective confidence values of a plurality of PMs, historical data indicating different thresholds, historical data indicating which PMs of the plurality of PMs are associated with CRC mis-detections and/or CRC false alarms, and/or the like. Using the historical data as inputs to the machine learning model, the network testing device may identify one or more relationships between thresholds and reductions in CRC mis-detections and/or CRC false alarms. The machine learning model may be trained and/or used in a similar manner to that described below with respect to FIGS. 2 and 3.

As shown by reference number 160, the network testing device may transmit, based on the candidate PDCCH payload corresponding to the passing PM, data to the base station. For example, the network testing device, after modifying functionality of the one or more emulated, simulated, and/or the like user devices of the network testing device according to the control information included in the candidate PDCCH payload corresponding to the passing PM, may cause at least one emulated, simulated, and/or the like user device to transmit data to the base station (e.g., to test one or more functionalities of the base station).

In some implementations, the network testing device may perform one or more additional actions. For example, the network testing device may retrain the machine learning model and/or the additional machine learning model based on at least one of the plurality of PMs, information concerning the CRC on the plurality of candidate PDCCH payloads, the confidence value of the passing PM, the threshold, whether the confidence value satisfies the threshold, and/or the like. In this way, the network testing device may continually reduce a likelihood of CRC mis-detections and/or CRC false alarms.

FIG. 1C illustrates an example flowchart that corresponds to the processing steps described herein in relation to FIGS. 1A-1B. As shown by reference number 170, the network testing device may receive a polar encoded PDCCH payload and may decode the polar encoded PDCCH payload using an SCL algorithm to generate a plurality of candidate PDCCH payloads and a plurality of PMs (e.g., as described herein in relation to FIG. 1A and reference numbers 110 and 120). As shown by reference number 171, the network testing device may perform a CRC on the plurality of candidate PDCCH payloads to identify a passing PM (e.g., as described herein in relation to FIG. 1A and reference number 130). When a PM is not a passing PM, the network testing device may discard the output associated with the PM (e.g., discard the candidate PDCCH payload associated with the PM). As shown by reference number 172, when the PM is a passing PM, the network testing device may normalize the PM values of the plurality of PMs and determine a confidence value associated with the passing PM (e.g., as described herein in relation to FIG. 1B and reference number 140). The network testing device may use a machine learning model to determine the confidence value. As shown by reference number 173, the network testing device may determine whether the confidence value satisfies (e.g., is greater than or equal to) a threshold (e.g., as described herein in relation to FIG. 1B and reference number 150). When the confidence value satisfies the threshold, the network testing device may output the candidate PDCCH payload corresponding to the passing PM. Additionally, or alternatively, when the confidence value does not satisfy the threshold (e.g., the network testing device determines that a false detection of a passing PM has occurred), the network testing device may discard the output associated with the passing PM (e.g., discard the candidate PDCCH payload associated with the passing PM) and may start the process over again by receiving and decoding a new polar encoded PDCCH payload (e.g., as described herein in relation to reference number 170).

As indicated above, FIGS. 1A-1C are provided as an example. Other examples may differ from what is described with regard to FIGS. 1A-1C. The number and arrangement of devices shown in FIGS. 1A-1C are provided as an example. In practice, there may be additional devices, fewer devices, different devices, or differently arranged than those shown in FIGS. 1A-1C. Furthermore, two or more devices shown in FIGS. 1A-1C may be implemented within a single device, or a single device shown in FIGS. 1A-1C may be implemented as multiple, distributed devices. Additionally, or alternatively, a set of devices (e.g., one or more devices) shown in FIGS. 1A-1C may perform one or more functions described as being performed by another set of devices shown in FIGS. 1A-1C.

Figure 2:
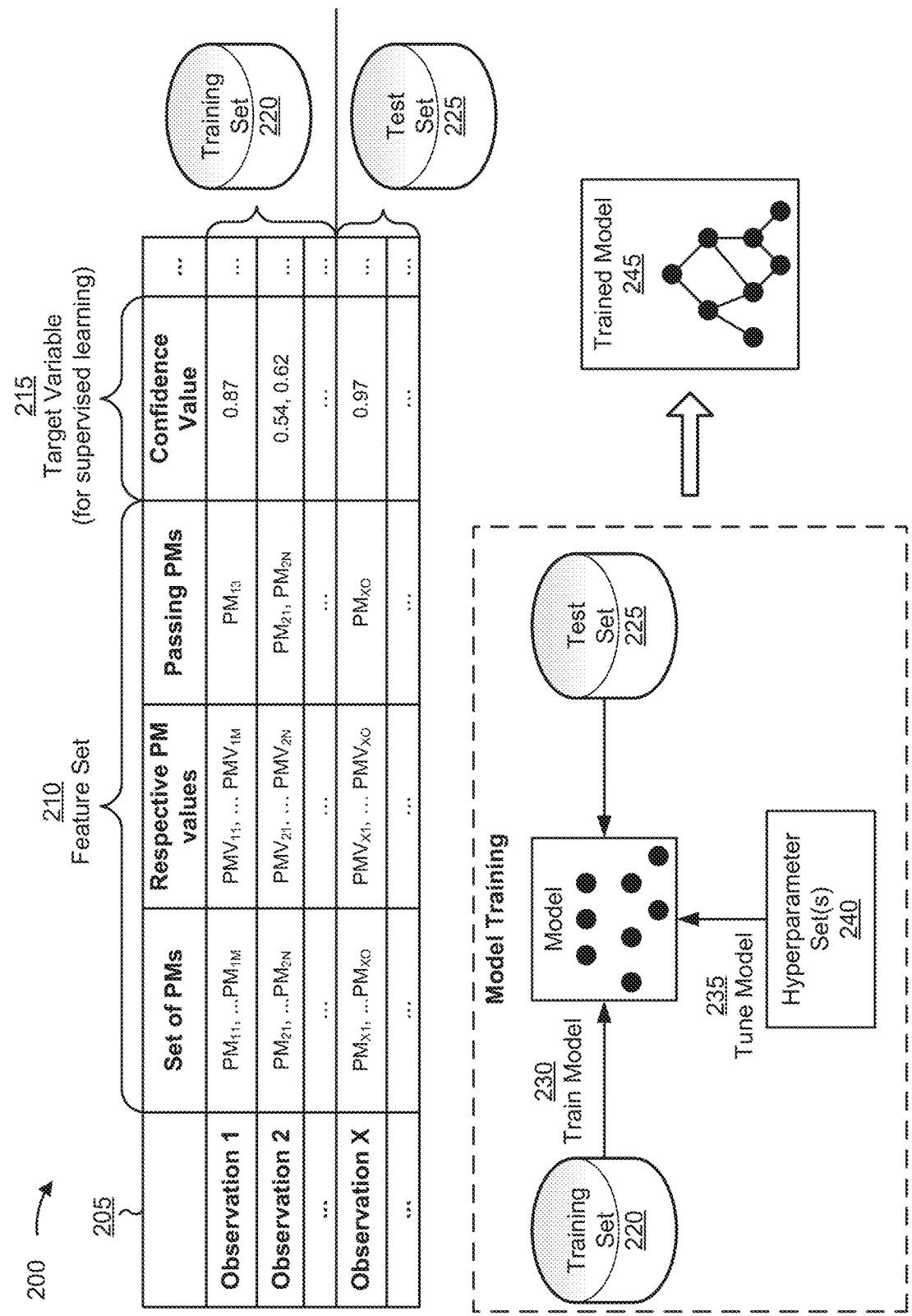
FIGS. 2 and 3 are diagrams of one or more example implementations described herein.

FIG. 2 is a diagram illustrating an example 200 of training a machine learning model. The machine learning model training described herein may be performed using a machine learning system. The machine learning system may include a computing device, a server, a cloud computing environment, a network testing device, and/or the like.

As shown by reference number 205, a machine learning model may be trained using a set of observations. The set of observations may be obtained and/or input from historical data, such as data gathered during one or more processes described herein. For example, the set of observations may include data gathered from obtaining a passing PM and/or determining a confidence value associated with the passing PM, as described elsewhere herein. In some implementations, the machine learning system may receive the set of observations (e.g., as input) from another device, such as a base station.

As shown by reference number 210, a feature set may be derived from the set of observations. The feature set may include a set of variable types. A variable type may be referred to as a feature. A specific observation may include a set of variable values corresponding to the set of variable types. A set of variable values may be specific to an observation. In some cases, different observations may be associated with different sets of variable values, sometimes referred to as feature values. In some implementations, the machine learning system may determine variable values for a specific observation based on input received from the base station. For example, the machine learning system may identify a feature set (e.g., one or more features and/or corresponding feature values) from structured data input to the machine learning system, such as by extracting data from a particular column of a table, extracting data from a particular field of a form, extracting data from a particular field of a message, extracting data received in a structured data format, and/or the like. In some implementations, the machine learning system may determine features (e.g., variables types) for a feature set based on input received from the base station, such as by extracting or generating a name for a column, extracting or generating a name for a field of a form and/or a message, extracting or generating a name based on a structured data format, and/or the like. Additionally, or alternatively, the machine learning system may receive input from an operator to determine features and/or feature values. In some implementations, the machine learning system may perform natural language processing and/or another feature identification technique to extract features (e.g., variable types) and/or feature values (e.g., variable values) from text (e.g., unstructured data) input to the machine learning system, such as by identifying keywords and/or values associated with those keywords from the text.

As an example, a feature set for a set of observations may include a first feature of a set of PMs, a second feature of respective PM values of the set of PMs, a third feature identifying passing PMs of the set of PMs, and so on. As shown, for a first observation, the first feature may include a set of PMs $PM_{11}$ through $PM_{1M}$, the second feature may include respective PM values of $PMV_{11}$ through $PMV_{1M}$, the third feature may identify $PM_{13}$ as a passing PM, and so on. These features and feature values are provided as examples, and may differ in other examples. In some implementations, the machine learning system may pre-process and/or perform dimensionality reduction to reduce the feature set and/or combine features of the feature set to a minimum feature set. A machine learning model may be trained on the minimum feature set, thereby conserving resources of the machine learning system (e.g., processing resources, memory resources, and/or the like) used to train the machine learning model.

As shown by reference number 215, the set of observations may be associated with a target variable type. The target variable type may represent a variable having a numeric value (e.g., an integer value, a floating point value, and/or the like), may represent a variable having a numeric value that falls within a range of values or has some discrete possible values, may represent a variable that is selectable from one of multiple options (e.g., one of multiples classes, classifications, labels, and/or the like), may represent a variable having a Boolean value (e.g., 0 or 1, True or False, Yes or No), and/or the like. A target variable type may be associated with a target variable value, and a target variable value may be specific to an observation. In some cases, different observations may be associated with different target variable values.

The target variable may represent a value that a machine learning model is being trained to predict, and the feature set may represent the variables that are input to a trained machine learning model to predict a value for the target variable. The set of observations may include target variable values so that the machine learning model can be trained to recognize patterns in the feature set that lead to a target variable value. A machine learning model that is trained to predict a target variable value may be referred to as a supervised learning model, a predictive model, and/or the like. When the target variable type is associated with continuous target variable values (e.g., a range of numbers and/or the like), the machine learning model may employ a regression technique. When the target variable type is associated with categorical target variable values (e.g., classes, labels, and/or the like), the machine learning model may employ a classification technique.

In some implementations, the machine learning model may be trained on a set of observations that do not include a target variable (or that include a target variable, but the machine learning model is not being executed to predict the target variable). This may be referred to as an unsupervised learning model, an automated data analysis model, an automated signal extraction model, and/or the like. In this case, the machine learning model may learn patterns from the set of observations without labeling or supervision, and may provide output that indicates such patterns, such as by using clustering and/or association to identify related groups of items within the set of observations.

As further shown, the machine learning system may partition the set of observations into a training set 220 that includes a first subset of observations, of the set of observations, and a test set 225 that includes a second subset of observations of the set of observations. The training set 220 may be used to train (e.g., fit, tune, and/or the like) the machine learning model, while the test set 225 may be used to evaluate a machine learning model that is trained using the training set 220. For example, for supervised learning, the test set 225 may be used for initial model training using the first subset of observations, and the test set 225 may be used to test whether the trained model accurately predicts target variables in the second subset of observations. In some implementations, the machine learning system may partition the set of observations into the training set 220 and the test set 225 by including a first portion or a first percentage of the set of observations in the training set 220 (e.g., 75%, 80%, or 85%, among other examples) and including a second portion or a second percentage of the set of observations in the test set 225 (e.g., 25%, 20%, or 15%, among other examples). In some implementations, the machine learning system may randomly select observations to be included in the training set 220 and/or the test set 225.

As shown by reference number 230, the machine learning system may train a machine learning model using the training set 220. This training may include executing, by the machine learning system, a machine learning algorithm to determine a set of model parameters based on the training set 220. In some implementations, the machine learning algorithm may include a regression algorithm (e.g., linear regression, logistic regression, and/or the like), which may include a regularized regression algorithm (e.g., Lasso regression, Ridge regression, Elastic-Net regression, and/or the like). Additionally, or alternatively, the machine learning algorithm may include a decision tree algorithm, which may include a tree ensemble algorithm (e.g., generated using bagging and/or boosting), a random forest algorithm, a boosted trees algorithm, and/or the like. A model parameter may include an attribute of a machine learning model that is learned from data input into the model (e.g., the training set 220). For example, for a regression algorithm, a model parameter may include a regression coefficient (e.g., a weight). For a decision tree algorithm, a model parameter may include a decision tree split location, as an example.

As shown by reference number 235, the machine learning system may use one or more hyperparameter sets 240 to tune the machine learning model. A hyperparameter may include a structural parameter that controls execution of a machine learning algorithm by the machine learning system, such as a constraint applied to the machine learning algorithm. Unlike a model parameter, a hyperparameter is not learned from data input into the model. An example hyperparameter for a regularized regression algorithm includes a strength (e.g., a weight) of a penalty applied to a regression coefficient to mitigate overfitting of the machine learning model to the training set 220. The penalty may be applied based on a size of a coefficient value (e.g., for Lasso regression, such as to penalize large coefficient values), may be applied based on a squared size of a coefficient value (e.g., for Ridge regression, such as to penalize large squared coefficient values), may be applied based on a ratio of the size and the squared size (e.g., for Elastic-Net regression), may be applied by setting one or more feature values to zero (e.g., for automatic feature selection), and/or the like. Example hyperparameters for a decision tree algorithm include a tree ensemble technique to be applied (e.g., bagging, boosting, a random forest algorithm, a boosted trees algorithm, and/or the like), a number of features to evaluate, a number of observations to use, a maximum depth of each decision tree (e.g., a number of branches permitted for the decision tree), a number of decision trees to include in a random forest algorithm, and/or the like.

To train a machine learning model, the machine learning system may identify a set of machine learning algorithms to be trained (e.g., based on operator input that identifies the one or more machine learning algorithms, based on random selection of a set of machine learning algorithms, and/or the like), and may train the set of machine learning algorithms (e.g., independently for each machine learning algorithm in the set) using the training set 220. The machine learning system may tune each machine learning algorithm using one or more hyperparameter sets 240 (e.g., based on operator input that identifies hyperparameter sets 240 to be used, based on randomly generating hyperparameter values, and/or the like). The machine learning system may train a particular machine learning model using a specific machine learning algorithm and a corresponding hyperparameter set 240. In some implementations, the machine learning system may train multiple machine learning models to generate a set of model parameters for each machine learning model, where each machine learning model corresponds to a different combination of a machine learning algorithm and a hyperparameter set 240 for that machine learning algorithm.

In some implementations, the machine learning system may perform cross-validation when training a machine learning model. Cross validation can be used to obtain a reliable estimate of machine learning model performance using only the training set 220, and without using the test set 225, such as by splitting the training set 220 into a number of groups (e.g., based on operator input that identifies the number of groups, based on randomly selecting a number of groups, and/or the like) and using those groups to estimate model performance. For example, using k-fold cross-validation, observations in the training set 220 may be split into k groups (e.g., in order or at random). For a training procedure, one group may be marked as a hold-out group, and the remaining groups may be marked as training groups. For the training procedure, the machine learning system may train a machine learning model on the training groups and then test the machine learning model on the hold-out group to generate a cross-validation score. The machine learning system may repeat this training procedure using different hold-out groups and different test groups to generate a cross-validation score for each training procedure. In some implementations, the machine learning system may independently train the machine learning model k times, with each individual group being used as a hold-out group once and being used as a training group k−1 times. The machine learning system may combine the cross-validation scores for each training procedure to generate an overall cross-validation score for the machine learning model. The overall cross-validation score may include, for example, an average cross-validation score (e.g., across all training procedures), a standard deviation across cross-validation scores, a standard error across cross-validation scores, and/or the like.

In some implementations, the machine learning system may perform cross-validation when training a machine learning model by splitting the training set into a number of groups (e.g., based on operator input that identifies the number of groups, based on randomly selecting a number of groups, and/or the like). The machine learning system may perform multiple training procedures and may generate a cross-validation score for each training procedure. The machine learning system may generate an overall cross-validation score for each hyperparameter set 240 associated with a particular machine learning algorithm. The machine learning system may compare the overall cross-validation scores for different hyperparameter sets 240 associated with the particular machine learning algorithm, and may select the hyperparameter set 240 with the best (e.g., highest accuracy, lowest error, closest to a desired threshold, and/or the like) overall cross-validation score for training the machine learning model. The machine learning system may then train the machine learning model using the selected hyperparameter set 240, without cross-validation (e.g., using all of data in the training set 220 without any hold-out groups), to generate a single machine learning model for a particular machine learning algorithm. The machine learning system may then test this machine learning model using the test set 225 to generate a performance score, such as a mean squared error (e.g., for regression), a mean absolute error (e.g., for regression), an area under receiver operating characteristic curve (e.g., for classification), and/or the like. If the machine learning model performs adequately (e.g., with a performance score that satisfies a threshold), then the machine learning system may store that machine learning model as a trained machine learning model 245 to be used to analyze new observations, as described below in connection with FIG. 3.

In some implementations, the machine learning system may perform cross-validation, as described above, for multiple machine learning algorithms (e.g., independently), such as a regularized regression algorithm, different types of regularized regression algorithms, a decision tree algorithm, different types of decision tree algorithms, and/or the like. Based on performing cross-validation for multiple machine learning algorithms, the machine learning system may generate multiple machine learning models, where each machine learning model has the best overall cross-validation score for a corresponding machine learning algorithm. The machine learning system may then train each machine learning model using the entire training set 220 (e.g., without cross-validation), and may test each machine learning model using the test set 225 to generate a corresponding performance score for each machine learning model. The machine learning model may compare the performance scores for each machine learning model, and may select the machine learning model with the best (e.g., highest accuracy, lowest error, closest to a desired threshold, and/or the like) performance score as the trained machine learning model 245.

As indicated above, FIG. 2 is provided as an example. Other examples may differ from what is described in connection with FIG. 2. For example, the machine learning model may be trained using a different process than what is described in connection with FIG. 2. Additionally, or alternatively, the machine learning model may employ a different machine learning algorithm than what is described in connection with FIG. 2, such as a Bayesian estimation algorithm, a k-nearest neighbor algorithm, an a priori algorithm, a k-means algorithm, a support vector machine algorithm, a neural network algorithm (e.g., a convolutional neural network algorithm), a deep learning algorithm, and/or the like.

Figure 3:
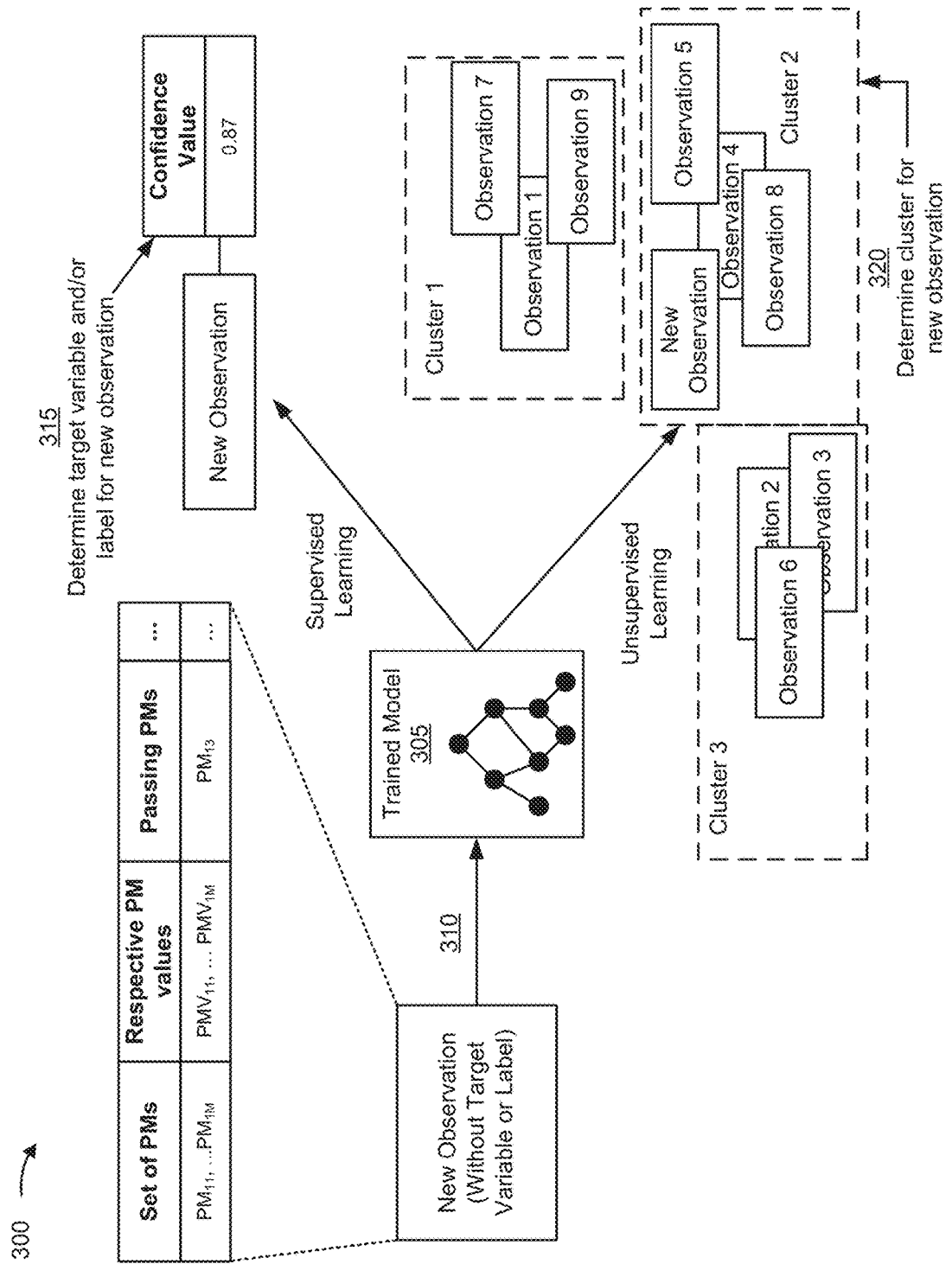

FIG. 3 is a diagram illustrating an example 300 of applying a trained machine learning model to a new observation. The new observation may be input to a machine learning system that stores a trained machine learning model 305. In some implementations, the trained machine learning model 305 may be the trained machine learning model 245 described above in connection with FIG. 2. The machine learning system may include a computing device, a server, a cloud computing environment, a network testing device, and/or the like.

As shown by reference number 310, the machine learning system may receive a new observation (or a set of new observations), and may input the new observation to the machine learning model 305. As shown, the new observation may include a first feature of a set of PMs, a second feature of respective PM values of the set of PMs, a third feature identifying passing PMs of the set of PMs, and so on, as an example. The machine learning system may apply the trained machine learning model 305 to the new observation to generate an output (e.g., a result). The type of output may depend on the type of machine learning model and/or the type of machine learning task being performed. For example, the output may include a predicted (e.g., estimated) value of a target variable (e.g., a value within a continuous range of values, a discrete value, a label, a class, a classification, and/or the like), such as when supervised learning is employed. Additionally, or alternatively, the output may include information that identifies a cluster to which the new observation belongs, information that indicates a degree of similarity between the new observation and one or more prior observations (e.g., which may have previously been new observations input to the machine learning model and/or observations used to train the machine learning model), and/or the like, such as when unsupervised learning is employed.

In some implementations, the trained machine learning model 305 may predict a value of 0.87, for example, for the target variable of a confidence value for the new observation, as shown by reference number 315. Based on this prediction (e.g., based on the value having a particular label/classification, based on the value satisfying or failing to satisfy a threshold, and/or the like), the machine learning system may provide a recommendation, such as a recommendation to output a PDCCH payload corresponding to the passing PM or discard the passing PM. Additionally, or alternatively, the machine learning system may perform an automated action and/or may cause an automated action to be performed (e.g., by instructing another device to perform the automated action), such as automatically outputting the PDCCH payload corresponding to the passing PM or discarding the passing PM. In some implementations, the recommendation and/or the automated action may be based on the target variable value having a particular label (e.g., classification, categorization, and/or the like), may be based on whether the target variable value satisfies one or more thresholds (e.g., whether the target variable value is greater than a threshold, is less than a threshold, is equal to a threshold, falls within a range of threshold values, and/or the like), and/or the like.

In some implementations, the trained machine learning model 305 may classify (e.g., cluster) the new observation in a particular cluster, as shown by reference number 320. The observations within a cluster may have a threshold degree of similarity. Based on classifying the new observation in the particular cluster, the machine learning system may provide a recommendation, such as a recommendation to output a PDCCH payload corresponding to the passing PM or discard the passing PM. Additionally, or alternatively, the machine learning system may perform an automated action and/or may cause an automated action to be performed (e.g., by instructing another device to perform the automated action), such as automatically outputting the PDCCH payload corresponding to the passing PM or discarding the passing PM.

In this way, the machine learning system may apply a rigorous and automated process to determining a confidence value associated with a passing PM. The machine learning system enables recognition and/or identification of tens, hundreds, thousands, or millions of features and/or feature values for tens, hundreds, thousands, or millions of observations, thereby increasing an accuracy and consistency of determining a confidence value associated with a passing PM, relative to requiring computing resources to be allocated for tens, hundreds, or thousands of operators to manually determine a confidence value associated with a passing PM using the features or feature values.

As indicated above, FIG. 3 is provided as an example. Other examples may differ from what is described in connection with FIG. 3.

Figure 4:
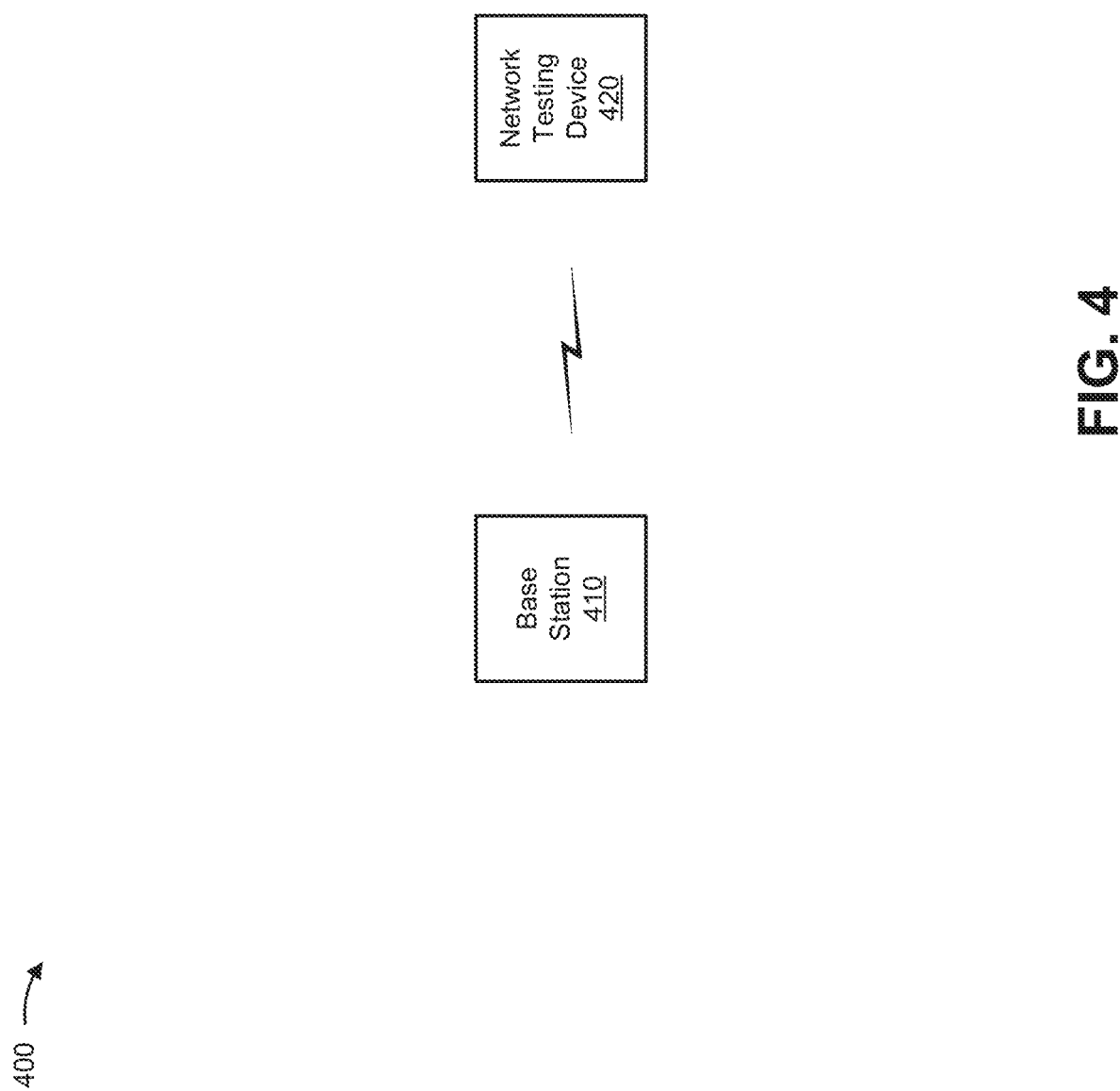
FIG. 4 is a diagram of an example environment in which systems and/or methods described herein may be implemented.

FIG. 4 is a diagram of an example environment 400 in which systems and/or methods described herein may be implemented. As shown in FIG. 4, environment 400 may include a base station 410 and a network testing device 420. Devices of environment 400 may interconnect via wired connections, wireless connections, or a combination of wired and wireless connections.

Base station 410 includes one or more devices capable of transferring traffic, such as encoded PDCCH payloads and/or other traffic, destined for and/or received from network testing device 420. In some implementations, base station 410 may include a next generation Node B (gNB) associated with a fifth generation (5G) network, an evolved Node B (eNB) associated with a long term evolution (LTE) network, and/or the like. Base station 410 may include a massive multiple-input multiple-output (MIMO) antenna system that utilizes time division duplexing (TDD). In some implementations, base station 410 may send traffic to and/or receive traffic from network testing device 420 via an air interface. Additionally, or alternatively, base station 410 may be connected to network testing device 420 via one or more RF cables (e.g., an antenna of base station 410 (e.g., an antenna of the massive MIMO antenna system) is connected to an antenna of network testing device 420) and may send traffic to and/or receive traffic from network testing device 420 via the one or more RF cables.

Network testing device 420 includes one or more devices capable of communicating traffic with base station 410, such as to receive encoded PDCCH payloads from base station 410 and/or transmit data to base station 410. For example, network testing device 420 may include a channel analyzer, a user device (e.g., a mobile phone (e.g., a smartphone or a radiotelephone), a laptop computer, a tablet computer, a gaming device, a wearable communication device (e.g., a smart wristwatch or a pair of smart eyeglasses), an Internet of things (IoT) device, or a similar type of device), a device to simulate a plurality of user devices, or a similar type of device. Network testing device 420 may include one or more antennas. In some implementations, network testing device 420 may send traffic to and/or receive traffic from base station 410 via an air interface. Additionally, or alternatively, network testing device 420 may be connected to base station 410 via one or more RF cables (e.g., an antenna of network testing device 420 may be connected to an antenna of base station 410) and may send traffic to and/or receive traffic from base station 410 via the one or more RF cables.

The number and arrangement of devices and networks shown in FIG. 4 are provided as an example. In practice, there may be additional devices and/or networks, fewer devices and/or networks, different devices and/or networks, or differently arranged devices and/or networks than those shown in FIG. 4. Furthermore, two or more devices shown in FIG. 4 may be implemented within a single device, or a single device shown in FIG. 4 may be implemented as multiple, distributed devices. Additionally, or alternatively, a set of devices (e.g., one or more devices) of environment 400 may perform one or more functions described as being performed by another set of devices of environment 400.

Figure 5:
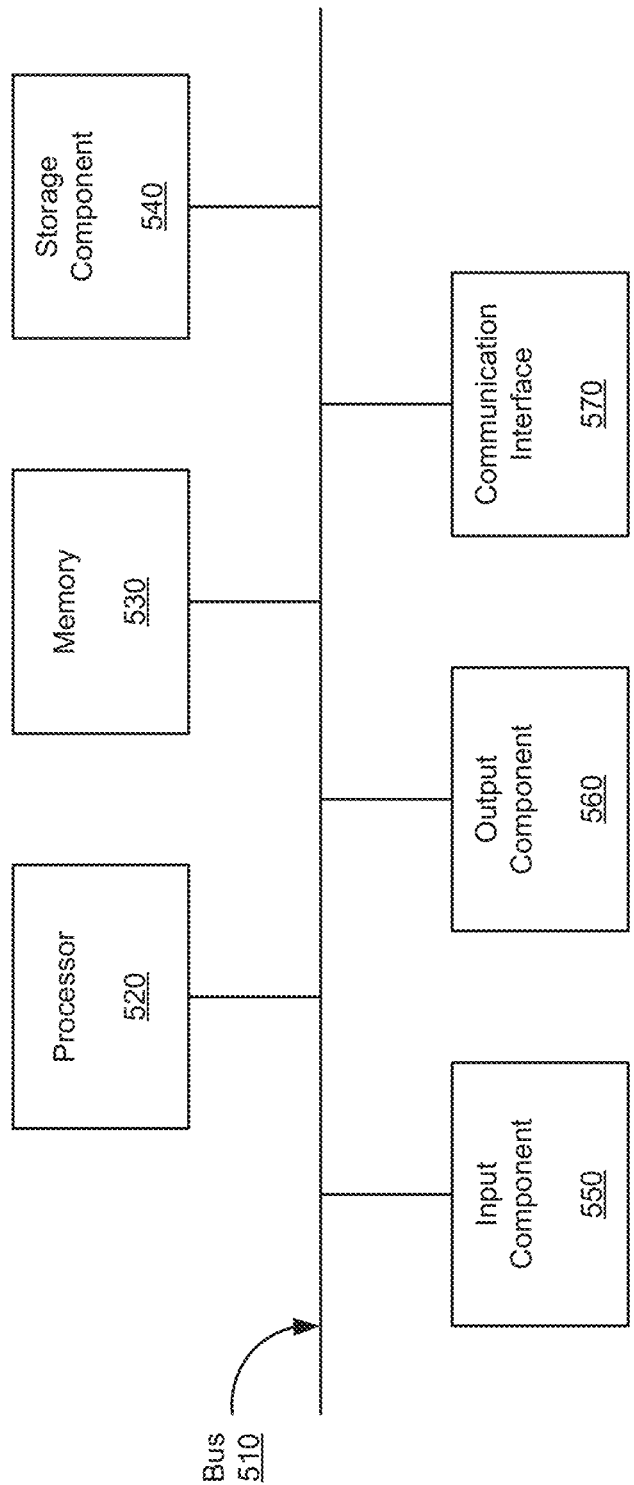
FIG. 5 is a diagram of example components of one or more devices of FIG. 2.

FIG. 5 is a diagram of example components of a device 500. Device 500 may correspond to base station 410 and/or network testing device 420. In some implementations, base station 410 and/or network testing device 420 may include one or more devices 500 and/or one or more components of device 500. As shown in FIG. 5, device 500 may include a bus 510, a processor 520, a memory 530, a storage component 540, an input component 550, an output component 560, and a communication interface 570.

Bus 510 includes a component that permits communication among the components of device 500. Processor 520 is implemented in hardware, firmware, or a combination of hardware and software. Processor 520 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 520 includes one or more processors capable of being programmed to perform a function. Memory 530 includes a random access memory (RAM), a read only memory (ROM), and/or another type of dynamic or static storage device (e.g., a flash memory, a magnetic memory, and/or an optical memory) that stores information and/or instructions for use by processor 520.

Storage component 540 stores information and/or software related to the operation and use of device 500. For example, storage component 540 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 550 includes a component that permits device 500 to receive information, such as via user input (e.g., a touch screen display, a keyboard, a keypad, a mouse, a button, a switch, and/or a microphone). Additionally, or alternatively, input component 550 may include a sensor for sensing information (e.g., a global positioning system (GPS) component, an accelerometer, a gyroscope, and/or an actuator). Output component 560 includes a component that provides output information from device 500 (e.g., a display, a speaker, and/or one or more LEDs).

Communication interface 570 includes a transceiver-like component (e.g., a transceiver and/or a separate receiver and transmitter) that enables device 500 to communicate with other devices, such as via a wired connection, a wireless connection, or a combination of wired and wireless connections. Communication interface 570 may permit device 500 to receive information from another device and/or provide information to another device. For example, communication interface 570 may include an Ethernet interface, an optical interface, a coaxial interface, an infrared interface, an RF interface, a universal serial bus (USB) interface, a wireless local area interface, a cellular network interface, and/or the like.

Device 500 may perform one or more processes described herein. Device 500 may perform these processes based on processor 520 executing software instructions stored by a non-transitory computer-readable medium, such as memory 530 and/or storage component 540. A computer-readable medium is defined herein as a non-transitory memory device. A memory device includes memory space within a single physical storage device or memory space spread across multiple physical storage devices.

Software instructions may be read into memory 530 and/or storage component 540 from another computer-readable medium or from another device via communication interface 570. When executed, software instructions stored in memory 530 and/or storage component 540 may cause processor 520 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 5 are provided as an example. In practice, device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
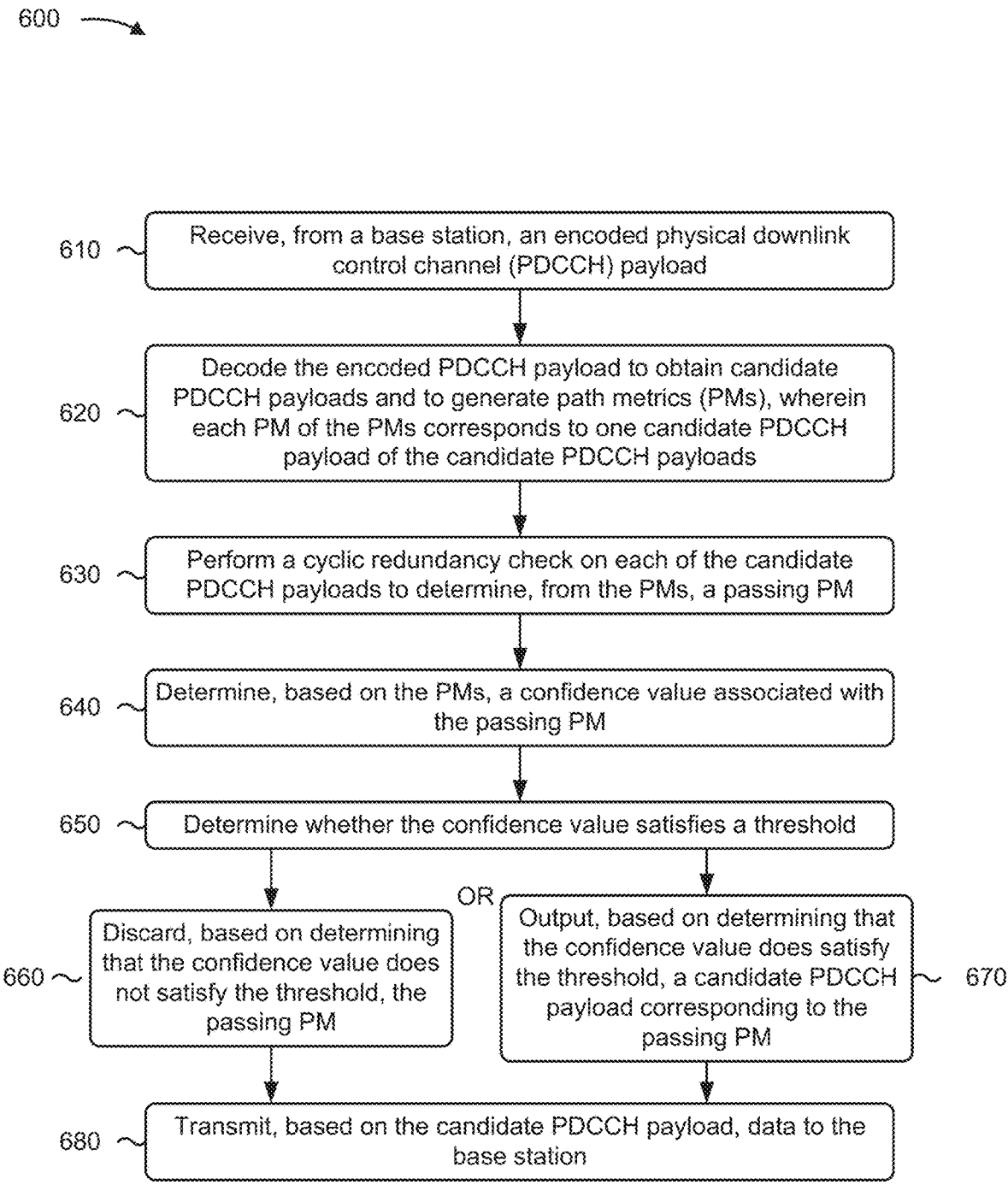
FIGS. 6-8 are flowcharts of example processes relating to reducing false detection of successful decoding of cyclic redundancy check codes.

FIG. 6 is a flowchart of an example process 600 for reducing false detection of successful decoding of cyclic redundancy check codes. In some implementations, one or more process blocks of FIG. 6 may be performed by a device (e.g., network testing device 420). In some implementations, one or more process blocks of FIG. 6 may be performed by another device or a group of devices separate from or including the device, such as another device (e.g., base station 410), and/or the like.

As shown in FIG. 6, process 600 may include receiving, from a base station, an encoded PDCCH payload (block 610). For example, the device (e.g., using processor 520, memory 530, storage component 540, input component 550, output component 560, communication interface 570, and/or the like) may receive, from a base station, an encoded PDCCH payload, as described above.

As further shown in FIG. 6, process 600 may include decoding the encoded PDCCH payload to obtain candidate PDCCH payloads and to generate PMs, wherein each PM of the PMs corresponds to one candidate PDCCH payload of the candidate PDCCH payloads (block 620). For example, the device (e.g., using processor 520, memory 530, storage component 540, input component 550, output component 560, communication interface 570, and/or the like) may decode the encoded PDCCH payload to obtain candidate PDCCH payloads and to generate PMs, as described above. In some implementations, each PM of the PMs corresponds to one candidate PDCCH payload of the candidate PDCCH payloads.

As further shown in FIG. 6, process 600 may include performing a cyclic redundancy check on each of the candidate PDCCH payloads to determine, from the PMs, a passing PM (block 630). For example, the device (e.g., using processor 520, memory 530, storage component 540, input component 550, output component 560, communication interface 570, and/or the like) may perform a cyclic redundancy check on each of the candidate PDCCH payloads to determine, from the PMs, a passing PM, as described above.

As further shown in FIG. 6, process 600 may include determining, based on the PMs, a confidence value associated with the passing PM (block 640). For example, the device (e.g., using processor 520, memory 530, storage component 540, input component 550, output component 560, communication interface 570, and/or the like) may determine, based on the PMs, a confidence value associated with the passing PM, as described above.

As further shown in FIG. 6, process 600 may include determining whether the confidence value satisfies a threshold (block 650). For example, the device (e.g., using processor 520, memory 530, storage component 540, input component 550, output component 560, communication interface 570, and/or the like) may determine whether the confidence value satisfies a threshold, as described above.

As further shown in FIG. 6, process 600 may include discarding, based on determining that the confidence value does not satisfy the threshold, the passing PM (block 660). For example, the device (e.g., using processor 520, memory 530, storage component 540, input component 550, output component 560, communication interface 570, and/or the like) may discard, based on determining that the confidence value does not satisfy the threshold, the passing PM, as described above.

As further shown in FIG. 6, process 600 may include outputting, based on determining that the confidence value does satisfy the threshold, a candidate PDCCH payload corresponding to the passing PM (block 670). For example, the device (e.g., using processor 520, memory 530, storage component 540, input component 550, output component 560, communication interface 570, and/or the like) may output, based on determining that the confidence value does satisfy the threshold, a candidate PDCCH payload corresponding to the passing PM, as described above.

As further shown in FIG. 6, process 600 may include transmitting, based on the PDCCH payload, data to the base station (block 680). For example, the device (e.g., using processor 520, memory 530, storage component 540, input component 550, output component 560, communication interface 570, and/or the like) may transmit, based on the candidate PDCCH payload, data to the base station, as described above.

Process 600 may include additional implementations, such as any single implementation or any combination of implementations described below and/or in connection with one or more other processes described elsewhere herein.

In a first implementation, each PM, of the PMs, has a PM value, and determining the confidence value associated with the passing PM comprises normalizing PM values of the PMs to obtain normalized PM values, averaging the normalized PM values to obtain an average normalized PM value, and determining a difference between a normalized PM value of the passing PM and the average normalized PM value, to obtain the confidence value associated with the passing PM.

In a second implementation, alone or in combination with the first implementation, process 600 includes determining, based on the PMs, respective confidence values associated with each of the PMs.

In a third implementation, alone or in combination with one or more of the first and second implementations, process 600 includes determining, based on the PMs and while performing the cyclic redundancy check on the candidate PDCCH payloads, respective confidence values associated with each of the PMs.

In a fourth implementation, alone or in combination with one or more of the first through third implementations, the passing PM is a first passing PM and the confidence value is a first confidence value, wherein performing the cyclic redundancy check on the candidate PDCCH payloads comprises performing the cyclic redundancy check on the candidate PDCCH payloads to determine, from the PMs, the first passing PM and a second passing PM, and process 600 further comprises determining, after discarding the first passing PM and based on the PMs, a second confidence value associated with the second passing PM, and determining whether the second confidence value satisfies the threshold.

In a fifth implementation, alone or in combination with one or more of the first through fourth implementations, each PM, of the PMs, has a PM value, and performing the cyclic redundancy check on the candidate PDCCH payloads comprises performing the cyclic redundancy check on a first candidate PDCCH payload having a lowest PM value to determine whether a first PM associated with the lowest PM value is error-free; performing, based on determining that the first PM is not error-free, the cyclic redundancy check on a second candidate PDCCH payload having a second lowest PM value to determine whether a second PM associated with the second lowest PM value is error-free; and obtaining, from the PMs and based on determining that the second PM is error-free, the passing PM, wherein the passing PM corresponds to the second PM.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
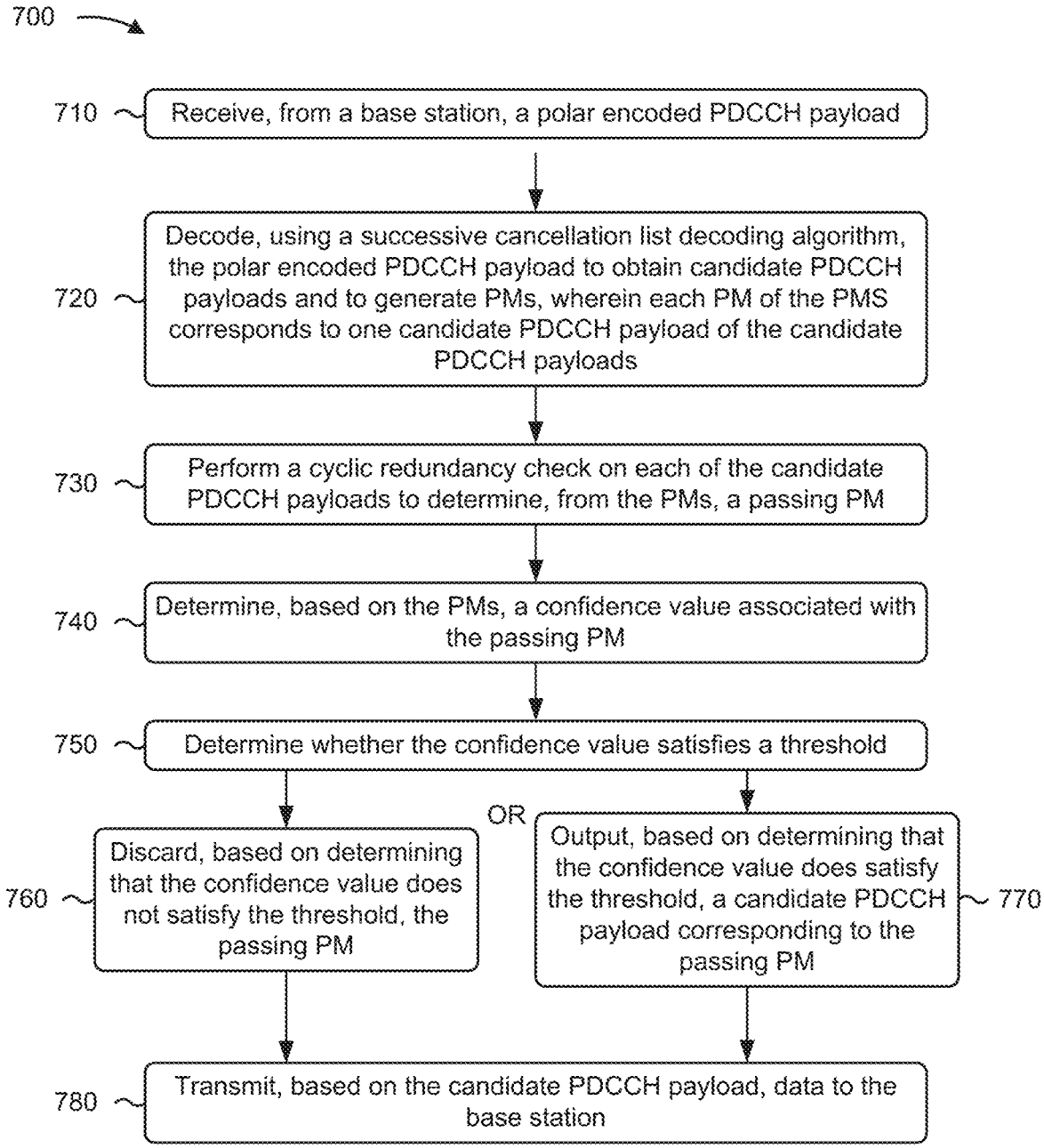

FIG. 7 is a flowchart of an example process 700 for reducing false detection of successful decoding of cyclic redundancy check codes. In some implementations, one or more process blocks of FIG. 7 may be performed by a device (e.g., network testing device 420). In some implementations, one or more process blocks of FIG. 7 may be performed by another device or a group of devices separate from or including the device, such as another device (e.g., base station 410), and/or the like.

As shown in FIG. 7, process 700 may include receiving, from a base station, a polar encoded PDCCH payload (block 710). For example, the device (e.g., using processor 520, memory 530, storage component 540, input component 550, output component 560, communication interface 570, and/or the like) may receive, from a base station, a polar encoded PDCCH payload, as described above.

As further shown in FIG. 7, process 700 may include decoding, using a successive cancellation list decoding algorithm, the polar encoded PDCCH payload to obtain candidate PDCCH payloads and to generate PMs, wherein each PM of the PMs corresponds to one candidate PDCCH payload of the candidate PDCCH payloads (block 720). For example, the device (e.g., using processor 520, memory 530, storage component 540, input component 550, output component 560, communication interface 570, and/or the like) may decode, using a successive cancellation list decoding algorithm, the polar encoded PDCCH payload to obtain candidate PDCCH payloads and to generate PMs, as described above. In some implementations, each PM of the PMs corresponds to one candidate PDCCH payload of the candidate PDCCH payloads.

As further shown in FIG. 7, process 700 may include performing a cyclic redundancy check on each of the candidate PDCCH payloads to determine, from the PMs, a passing PM (block 730). For example, the device (e.g., using processor 520, memory 530, storage component 540, input component 550, output component 560, communication interface 570, and/or the like) may perform a cyclic redundancy check on each of the candidate PDCCH payloads to determine, from the PMs, a passing PM, as described above.

As further shown in FIG. 7, process 700 may include determining, based on the PMs, a confidence value associated with the passing PM (block 740). For example, the device (e.g., using processor 520, memory 530, storage component 540, input component 550, output component 560, communication interface 570, and/or the like) may determine, based on the PMs, a confidence value associated with the passing PM, as described above.

As further shown in FIG. 7, process 700 may include determining whether the confidence value satisfies a threshold (block 750). For example, the device (e.g., using processor 520, memory 530, storage component 540, input component 550, output component 560, communication interface 570, and/or the like) may determine whether the confidence value satisfies a threshold, as described above.

As further shown in FIG. 7, process 700 may include discarding, based on determining that the confidence value does not satisfy the threshold, the passing PM (block 760). For example, the device (e.g., using processor 520, memory 530, storage component 540, input component 550, output component 560, communication interface 570, and/or the like) may discard, based on determining that the confidence value does not satisfy the threshold, the passing PM, as described above.

As further shown in FIG. 7, process 700 may include outputting, based on determining that the confidence value does satisfy the threshold, a candidate PDCCH payload corresponding to the passing PM (block 770). For example, the device (e.g., using processor 520, memory 530, storage component 540, input component 550, output component 560, communication interface 570, and/or the like) may output, based on determining that the confidence value does satisfy the threshold, a candidate PDCCH payload corresponding to the passing PM, as described above.

As further shown in FIG. 7, process 700 may include transmitting, based on the candidate PDCCH payload, data to the base station (block 780). For example, the device (e.g., using processor 520, memory 530, storage component 540, input component 550, output component 560, communication interface 570, and/or the like) may transmit, based on the candidate PDCCH payload, data to the base station, as described above.

Process 700 may include additional implementations, such as any single implementation or any combination of implementations described below and/or in connection with one or more other processes described elsewhere herein.

In a first implementation, each PM, of the PMs, has a PM value, and determining the confidence value associated with the passing PM comprises normalizing PM values of the PMs to obtain normalized PM values, averaging the normalized PM values to obtain an average normalized PM value, and determining a difference between a normalized PM value of the passing PM and the average normalized PM value, to obtain the confidence value associated with the passing PM.

In a second implementation, alone or in combination with the first implementation, process 700 includes determining, based on the PMs, respective confidence values associated with each of the PMs.

In a third implementation, alone or in combination with one or more of the first and second implementations, process 700 includes determining, based on the PMs and while performing the cyclic redundancy check on the candidate PDCCH payloads, respective confidence values associated with each of the PMs.

In a fourth implementation, alone or in combination with one or more of the first through third implementations, the passing PM is a first passing PM and the confidence value is a first confidence value, wherein performing the cyclic redundancy check on the candidate PDCCH payloads comprises performing the cyclic redundancy check on the candidate PDCCH payloads to determine, from the PMs, the first passing PM and a second passing PM, and process 700 further includes determining, after discarding the first passing PM and based on the PMs, a second confidence value associated with the second passing PM, and determining whether the second confidence value satisfies the threshold.

In a fifth implementation, alone or in combination with one or more of the first through fourth implementations, the device is a network testing device.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
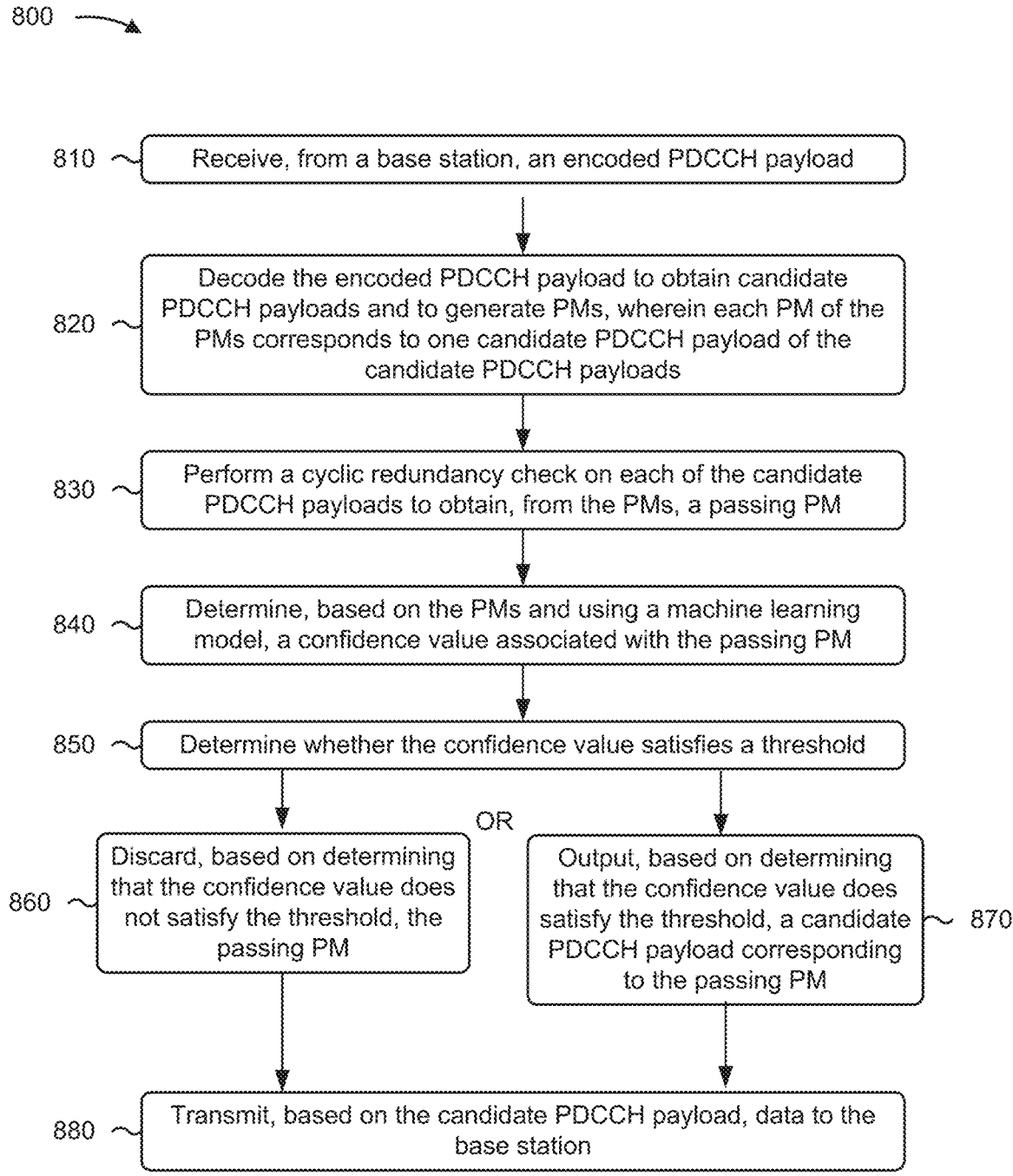

FIG. 8 is a flowchart of an example process 800 for reducing false detection of successful decoding of cyclic redundancy check codes. In some implementations, one or more process blocks of Fig. may be performed by a device (e.g., network testing device 420). In some implementations, one or more process blocks of FIG. 8 may be performed by another device or a group of devices separate from or including the device, such as another device (e.g., base station 410), and/or the like.

As shown in FIG. 8, process 800 may include receiving, from a base station, an encoded PDCCH payload (block 810). For example, the device (e.g., using processor 520, memory 530, storage component 540, input component 550, output component 560, communication interface 570, and/or the like) may receive, from a base station, an encoded PDCCH payload, as described above.

As further shown in FIG. 8, process 800 may include decoding the encoded PDCCH payload to obtain candidate PDCCH payloads and to generate PMs, wherein each PM of the PMs corresponds to one candidate PDCCH payload of the candidate PDCCH payloads (block 820). For example, the device (e.g., using processor 520, memory 530, storage component 540, input component 550, output component 560, communication interface 570, and/or the like) may decode the encoded PDCCH payload to obtain candidate PDCCH payloads and to generate PMs, as described above. In some implementations, each PM of the PMs corresponds to one candidate PDCCH payload of the candidate PDCCH payloads.

As further shown in FIG. 8, process 800 may include performing a cyclic redundancy check on each of the candidate PDCCH payloads to obtain, from the PMs, a passing PM (block 830). For example, the device (e.g., using processor 520, memory 530, storage component 540, input component 550, output component 560, communication interface 570, and/or the like) may perform a cyclic redundancy check on each of the candidate PDCCH payloads to obtain, from the PMs, a passing PM, as described above.

As further shown in FIG. 8, process 800 may include determining, based on the PMs and using a machine learning model, a confidence value associated with the passing PM (block 840). For example, the device (e.g., using processor 520, memory 530, storage component 540, input component 550, output component 560, communication interface 570, and/or the like) may determine, based on the PMs and using a machine learning model, a confidence value associated with the passing PM, as described above.

As further shown in FIG. 8, process 800 may include determining whether the confidence value satisfies a threshold (block 850). For example, the device (e.g., using processor 520, memory 530, storage component 540, input component 550, output component 560, communication interface 570, and/or the like) may determine whether the confidence value satisfies a threshold, as described above.

As further shown in FIG. 8, process 800 may include discarding, based on determining that the confidence value does not satisfy the threshold, the passing PM (block 860). For example, the device (e.g., using processor 520, memory 530, storage component 540, input component 550, output component 560, communication interface 570, and/or the like) may discard, based on determining that the confidence value does not satisfy the threshold, the passing PM, as described above.

As further shown in FIG. 8, process 800 may include outputting, based on determining that the confidence value does satisfy the threshold, a candidate PDCCH payload corresponding to the passing PM (block 870). For example, the device (e.g., using processor 520, memory 530, storage component 540, input component 550, output component 560, communication interface 570, and/or the like) may output, based on determining that the confidence value does satisfy the threshold, a candidate PDCCH payload corresponding to the passing PM, as described above.

As further shown in FIG. 8, process 800 may include transmitting, based on the candidate PDCCH payload, data to the base station (block 880). For example, the device (e.g., using processor 520, memory 530, storage component 540, input component 550, output component 560, communication interface 570, and/or the like) may transmit, based on the PDCCH payload, data to the base station, as described above.

Process 800 may include additional implementations, such as any single implementation or any combination of implementations described below and/or in connection with one or more other processes described elsewhere herein.

In a first implementation, each PM, of the PMs, has a PM value, and determining the confidence value associated with the passing PM includes normalizing PM values of the PMs to obtain normalized PM values, averaging the normalized PM values to obtain an average normalized PM value, and determining a difference between a normalized PM value of the passing PM and the average normalized PM value, to obtain the confidence value associated with the passing PM.

In a second implementation, alone or in combination with the first implementation, process 800 includes retraining the machine learning model based on at least one of the PMs, the cyclic redundancy check on the candidate PDCCH payloads, the confidence value, the threshold, or whether the confidence value satisfies the threshold.

In a third implementation, alone or in combination with one or more of the first and second implementations, the machine learning model is a first machine learning model, and process 800 includes determining the threshold using a second machine learning model.

In a fourth implementation, alone or in combination with one or more of the first through third implementations, process 800 includes retraining the second machine learning model based on at least one of the PMs, the cyclic redundancy check on the candidate PDCCH payloads, the confidence value, the threshold, or whether the confidence value satisfies the threshold.

In a fifth implementation, alone or in combination with one or more of the first through fourth implementations, process 800 includes determining, based on the PMs and while performing the cyclic redundancy check on the candidate PDCCH payloads, respective confidence values associated with each of the PMs.

In a sixth implementation, alone or in combination with one or more of the first through fifth implementations, the passing PM is a first passing PM, the confidence value is a first confidence value, and performing the cyclic redundancy check on the candidate PDCCH payloads includes performing the cyclic redundancy check on the candidate PDCCH payloads to obtain, from the PMs, the first passing PM and a second passing PM, wherein process 800 further includes determining, after discarding the first passing PM and based on the PMs, a second confidence value associated with a second passing PM, and determining whether the second confidence value satisfies the threshold.

In a seventh implementation, alone or in combination with one or more of the first through sixth implementations, each PM, of the PMs, has a PM value, and performing the cyclic redundancy check on the candidate PDCCH payloads includes performing the cyclic redundancy check on a first candidate PDCCH payload having a lowest PM value to determine whether the lowest PM is error-free; performing, based on determining that the lowest PM is not error-free, the cyclic redundancy check on a second candidate PDCCH payload having a second lowest PM value to determine whether the second lowest PM is error-free; and obtaining, from the PMs and based on determining that the second lowest PM is error-free, the passing PM, wherein the passing PM corresponds to the second lowest PM.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations.

As used herein, the term "component" is intended to be broadly construed as hardware, firmware, or a combination of hardware and software.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, etc., depending on the context.

It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method, comprising:
   determining, by a device, a confidence value associated with a passing path metric (PM) based on processing the passing PM using a machine learning model trained on historical PM values;
   determining, by the device, whether the confidence value satisfies a threshold;
   discarding, by the device and based on determining that the confidence value does not satisfy the threshold, the passing PM; or
   outputting, by the device and based on determining that the confidence value does satisfy the threshold, a candidate physical downlink control channel (PDCCH) payload corresponding to the passing PM; and
   transmitting, by the device and based on the candidate PDCCH payload, data to a base station.

2. The method of claim 1, wherein determining the confidence value comprises:
   determining the confidence value based on an average normalized PM value.

3. The method of claim 1, wherein the machine learning model is trained based on historical confidence values.

4. The method of claim 1, wherein the threshold is determined based on an additional machine learning model.

5. The method of claim 1, further comprising:
   determining another confidence value associated with another passing PM;
   determining whether the other confidence value satisfies the threshold; and
   discarding the other confidence value based on determining that the other confidence value does not satisfy the threshold.

6. The method of claim 1, further comprising:
   retraining the machine learning model based on the passing PM or the confidence value.

7. The method of claim 1, wherein the passing PM is identified as the passing PM based on a cyclic redundancy check.

8. A device, comprising:
   one or more memories; and one or more processors, coupled to the one or more memories, configured to:
  determine a confidence value associated with a passing path metric (PM) based on processing the passing PM using a machine learning model trained on historical PM values;
  determine whether the confidence value satisfies a threshold;
  discard, based on determining that the confidence value does not satisfy the threshold, the passing PM; or
  output, based on determining that the confidence value does satisfy the threshold, a candidate physical downlink control channel (PDCCH) payload corresponding to the passing PM; and
  transmit, based on the candidate PDCCH payload, data to a base station.

9. The device of claim 8, wherein the one or more processors, to determine the confidence value, are configured to:
  determine the confidence value based on an average normalized PM value.

10. The device of claim 8, wherein the machine learning model is trained based on historical confidence values.

11. The device of claim 8, wherein the threshold is determined based on an additional machine learning model.

12. The device of claim 8, wherein the one or more processors are further configured to:
  determine another confidence value associated with another passing PM;
  determine whether the other confidence value satisfies the threshold; and
  discard the other confidence value based on determining that the other confidence value does not satisfy the threshold.

13. The device of claim 8, wherein the one or more processors are further configured to:
  retrain the machine learning model based on the passing PM or the confidence value.

14. The device of claim 8, wherein the passing PM is identified as the passing PM based on a cyclic redundancy check.

15. A non-transitory computer-readable medium storing a set of instructions, the set of instructions comprising:
  one or more instructions that, when executed by one or more processors of a device, cause the device to:
    determine a confidence value associated with a passing path metric (PM) based on processing the passing PM using a machine learning model trained on historical PM values;
    determine whether the confidence value satisfies a threshold;
    discard, based on determining that the confidence value does not satisfy the threshold, the passing PM; or
    output, based on determining that the confidence value does satisfy the threshold, a candidate physical downlink control channel (PDCCH) payload corresponding to the passing PM; and
    transmit, based on the candidate PDCCH payload, data to a base station.

16. The non-transitory computer-readable medium of claim 15, wherein the one or more instructions, that cause the device to determine the confidence value, cause the device to:
  determine the confidence value based on an average normalized PM value.

17. The non-transitory computer-readable medium of claim 15, wherein the machine learning model is trained based on historical confidence values.

18. The non-transitory computer-readable medium of claim 15, wherein the threshold is determined based on an additional machine learning model.

19. The non-transitory computer-readable medium of claim 15, wherein the one or more instructions further cause the device to:
  determine another confidence value associated with another passing PM;
  determine whether the other confidence value satisfies the threshold; and
  discard the other confidence value based on determining that the other confidence value does not satisfy the threshold.

20. The non-transitory computer-readable medium of claim 15, wherein the one or more instructions further cause the device to:
  retrain the machine learning model based on the passing PM or the confidence value.

* * * * *